US006651078B1

(12) United States Patent
Gershon et al.

(10) Patent No.: US 6,651,078 B1
(45) Date of Patent: Nov. 18, 2003

(54) METHOD FOR DETERMINING A DECIMATION PATTERN IN A NETWORK COMMUNICATIONS RECEIVER

(75) Inventors: Eugen Gershon, San Jose, CA (US); Chien-Meen Hwang, San Jose, CA (US)

(73) Assignee: Legerity Inc, Austin, TX (US)

( * ) Notice: Subject to any disclaimer, the term of this patent is extended or adjusted under 35 U.S.C. 154(b) by 0 days.

(21) Appl. No.: 09/510,775

(22) Filed: Feb. 23, 2000

(51) Int. Cl.[7] .................................................. G06F 17/17

(52) U.S. Cl. ....................................................... 708/313

(58) Field of Search ................................. 708/300–323; 341/61

(56) References Cited

U.S. PATENT DOCUMENTS 5,396,489 A * 3/1995 Harrison ..................... 708/313

* cited by examiner

Primary Examiner—Tan V. Mai
(74) Attorney, Agent, or Firm—Renner, Otto, Boisselle & Sklar

(57) ABSTRACT

A method for selecting a decimation phase of a decimation filter includes determining a phase strength value for each phase of a plurality of phases. The quantity of phases corresponds to the decimation factor of the decimation filter. The phase strength value for a particular phase group may be representative of the sum of the magnitudes of a plurality of phase values in such particular phase group. The phase strength value for a particular phase group may represent the sum of the squares of a plurality of phase values in the group. The phase of the decimation filter is set to retain the phase with the greatest phase strength value and to filter, or decimate, the other phases.

10 Claims, 4 Drawing Sheets

METHOD FOR DETERMINING A DECIMATION PATTERN IN A NETWORK COMMUNICATIONS RECEIVER

TECHNICAL FIELD

The present invention relates generally to network interfacing, and more particularly, to a method for determining a decimation pattern in a network communications receiver.

BACKGROUND OF THE INVENTION

The transmission of various types of digital data between computers continues to grow in importance. The predominant method of transmitting such digital data includes coding the digital data into a low frequency baseband data signal and modulating the baseband data signal onto a high frequency carrier signal. The high frequency carrier signal is then transmitted across a network physical transmission medium such as electrical cable, fiber optic, RF, or other medium to a remote computing station.

At the remote computing station, the high frequency carrier signal must be received and demodulated to recover the original baseband signal. In the absence of any distortion across the network medium, the received signal would be identical in phase, amplitude, and frequency to the transmitted carrier and could be demodulated using known mixing techniques to recover the baseband signal. The baseband signal could then be recovered into digital data using known sampling algorithms.

One problem with such networks is that the physical medium and network topology tend to distort the high frequency carrier signal. Branch connections and different lengths of such branches cause reflections of the transmitted signal. Such problems are even more apparent in a network which uses home telephone wiring cables as the network physical medium. The typical wiring of the telephone network is designed for the "plain old telephone service" (POTS) signals in the 3–10 kilohertz frequency and are not designed for transmission of high frequency carrier signals in a frequency range greater than 1 MHz. The high frequency carrier signal is also distorted by transients in wiring characteristics due to on-hook and off-hook switching and noise pulses of the POTS (e.g. ringing). The high frequency carrier is further distorted by spurious noise caused by electrical devices operating in close proximity to the "cable" medium.

Such distortion of frequency, amplitude, and phase of the high frequency carrier signal degrades network performance and tends to impede the design of higher data rate networks. Known techniques for compensating for such distortion and improving the data rate of a network include complex modulation schemes and frequency diversity.

Utilizing a complex modulation scheme such as quadrature amplitude modulation (QAM), both the amplitude and phase of the high frequency carrier are modulated to represent I and Q components of a baseband signal. Referring to FIG. 1, a 4-QAM modulation constellation 10 is shown. In operation, each data symbol is represented by an I-value of +1 or −1 and a Q-value of +1 or −1 such that the data symbol can be represented by one of the four states 12(a)–12(d) in constellation 10. Each constellation pointy 12(a)–12(d) represents a unique combination of carrier amplitude and phase. For example, constellation point 12(a) represents a carrier amplitude of 14 and a carrier phase 16.

FIG. 2 illustrates the utilization of frequency diversity by transmitting the same data in three mutually exclusive sub-spectra 18(a)–18(c) of the transmission band 20. Therefore, if a portion of the band is distorted (e.g. one or more of the sub-spectra 18(a)–18(c)), the data may still be recovered at the receiver from a less distorted portion of the sub-spectra 18(a)–18(c). For example, a data signal modulated onto a 7 MHz carrier utilizing 6 MHz of bandwidth may include three mutually exclusive sub-bands 18(a)–18(c) centered at 5 MHz, 7 MHz and 9 MHz.

One approach to demodulating such complex signals is to use filters implemented by digital signal processing (DSP), which provides for a convenient way of varying filter coefficients for each transmission to accommodate carrier distortion as detected in the particular time frame in which the data is being transmitted. Using such approach, the receiver compares the distorted received signal representing a known preamble transmission (prior to the data transmission) to the undistorted waveform of the preamble and determines the appropriate filter coefficients for recovery of the received signal. Such filter coefficients are then used for receiving the data transmission.

In accordance with DSP technology, the high frequency carrier is typically sampled with an A/D converter at a rate that is at least 4 times the carrier frequency. Assuming a carrier frequency on the order of 7 MHz, the sampling rate will be on the order of 30 MHz. A problem associated with processing digital samples at such rates to demodulate a complex modulated carrier, and to process mutually exclusive sub-bands of a frequency diverse system, is that very large and costly DSPs would be required. A known solution to reduce the hardware size and complexity is to use decimation filters to reduce the sampling rate. A problem associated with decimation filters is that they ignore, or decimate, a significant portion of the samples, which can significantly degrade the quality of the reduced frequency signal represented by the retained samples. Therefore, there is a need for a decimation filter and an associated method for selecting samples for retention that do not suffer the disadvantages associated known systems.

SUMMARY OF THE INVENTION

A first aspect of the present invention is to provide a method of selecting a decimation phase of a decimation filter to filter a sequence of samples, comprising the steps of: a) determining a plurality of phase groups; b) assigning each sample to one of the plurality of phase groups; c) calculating a phase strength value for each phase group; and d) selecting the phase group with the greatest phase strength value as the selected decimation phase. The quantity of the plurality of phase groups may be equal to a decimation factor of the decimation filter. The phase strength value of a phase group may represent the sum of sample magnitudes in the phase group of the sum of the squares of sample magnitudes in the phase group.

The sequence of samples may represent a frequency diverse redundant data signal comprising a plurality of adjacent sub spectrums and a decimation factor of the decimation filter may be equal to an input sample frequency divided by a frequency difference between the center of two adjacent sub spectrums. The phase strength value of a phase group may represent the sum of sample magnitudes in the phase group of the sum of the squares of sample magnitudes in the phase group. The data signal may be a baseband signal or other than baseband.

DESCRIPTION OF THE PREFERRED EMBODIMENTS

Figure 1:
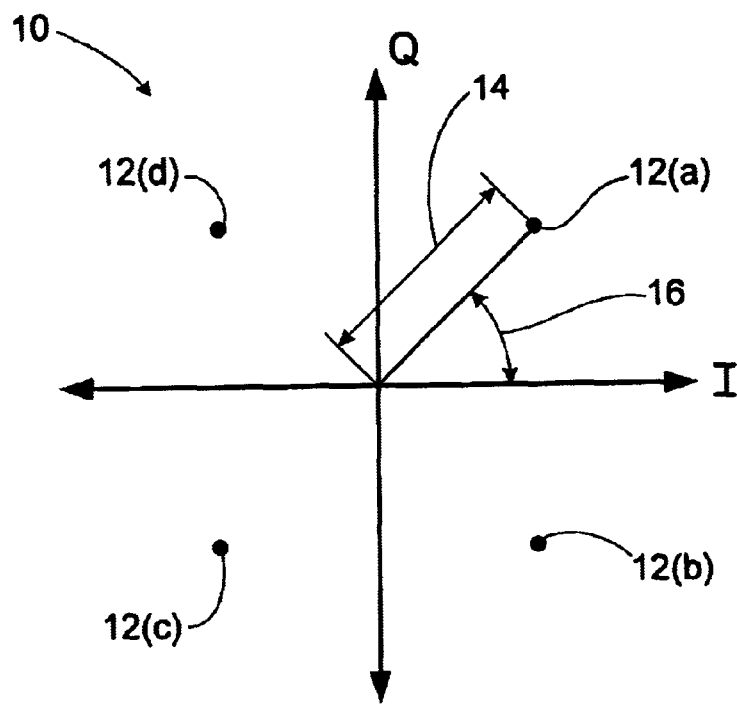
FIG. 1 is a diagram of a complex modulation constellation useful in the practice of the present invention.

The present invention will now be described in detail with reference to the drawings. In the drawings, like reference numerals are used to refer to like elements throughout.

Figure 3:
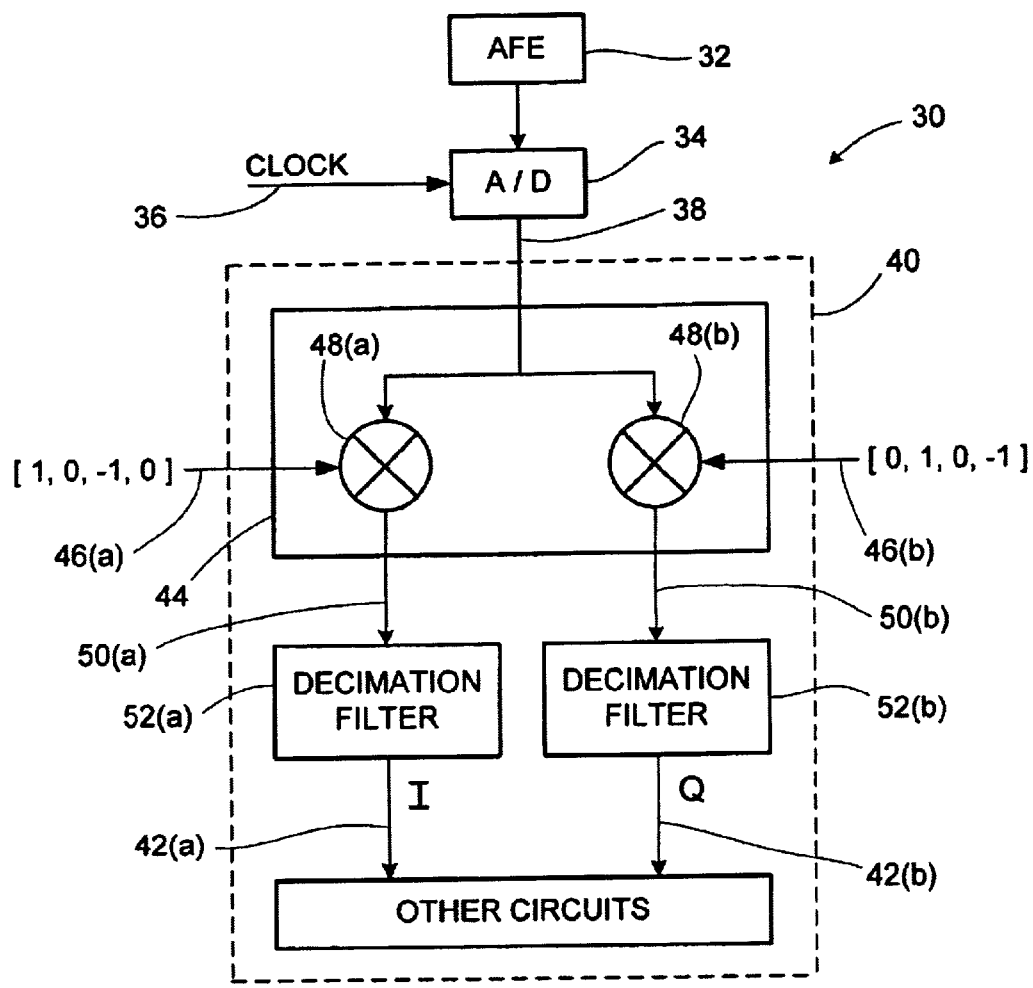
FIG. 3 is a block diagram of a first embodiment of a device for recovery of baseband signals in accordance with the present invention.

Referring to FIG. 3, a block diagram of a first embodiment of a device 30 of this invention for recovering base band I and Q-signals from a frequency diverse quadrature amplitude modulated (QAM) carrier is shown. Device 30 includes analog front end 32 which includes known analog circuits tuned to the modulated carrier frequency for receiving a carrier signal from the transmission medium and amplifying such signal as appropriate for sampling by A/D converter 34. In the preferred embodiment A/D converter 34 is an 10-bit A/D converter. In this first embodiment, the A/D converter 34 is driven by a sampling clock signal 36 with a frequency that is four-times that of the modulated carrier frequency. The output of the A/D converter 34 is a digitized carrier signal 38 comprising a sequence of 10-bit sample values at a sample frequency that is four-times that of the modulated carrier frequency (e.g. a 7 MHz modulated carrier is sampled by an A/D converter clocked at 28 MHz such that the digitized carrier signal 38 is a sequence of sample values at a rate of 28 MHz). The digitized samples of the carrier signal 38 is then processed by a demodulator 40 for recovery of the baseband I and Q-signals 42($a$) and 42($b$), respectively, in accordance with a first embodiment of this invention.

The demodulator 40 includes mixer 44 for separating the I and Q-channels from the digitized carrier signal 38. Mixer 44 includes an I-channel mixer 48($a$) which mixes the digitized carrier signal 38 with a sequence of values representing a digitized sine wave 46($a$). In this first embodiment, the digitized sine wave 46($a$) has a frequency equal to the carrier frequency such that mixer 48($a$) mixes the digitized carrier signal 38 down to a frequency diverse baseband signal 50($a$). Because the present invention uses digital signal processing, the digitized sine wave 46($a$) must be represented by a sequence of digital values clocked at the same frequency as the sample frequency (e.g. four-times the modulated carrier frequency) such that mixer 48($a$) is simply a multiplier. It should be appreciated that the digitized sine wave 46($a$) can be represented by a repetitive sequence of values [1,0,−1,0] clocked at four-times the digitized sine wave 46($a$) frequency. As such, the DSP hardware for performing the multiplication can be significantly simplified. For example, in this first embodiment a 7 MHz modulated carrier is represented by a series of samples clocked at 28 MHz and is mixed down by mixing with a 7 MHz digitized sine wave represented by a repetitive sequence of [1,0,−1,0] which is also clocked at 28 MHz.

Figure 2:
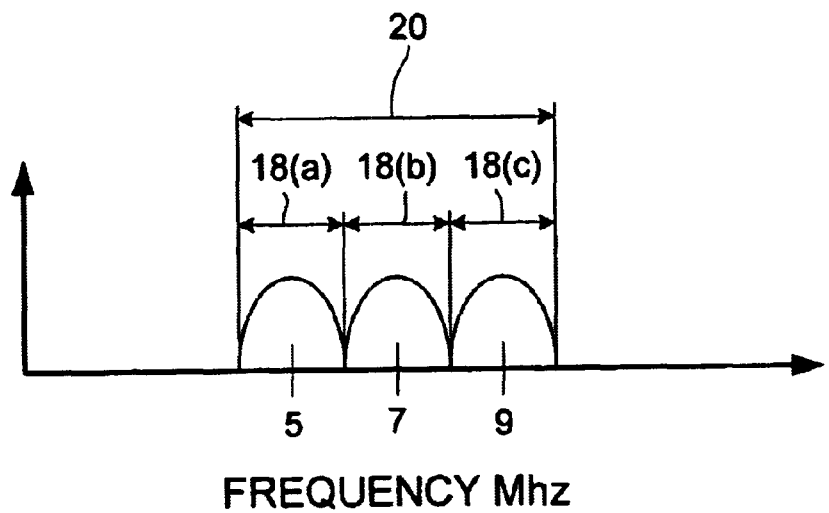
FIG. 2 is a frequency domain diagram of a frequency diverse signal useful in the practice of the present invention.

The frequency diverse baseband signal 50($a$) is input to a decimation filter 52($a$). The purpose of the decimation filter 52($a$) is to reduce the sample frequency and fold the three mutually exclusive sub-spectra 18($a$)–18($c$) (FIG. 2) to the baseband I-signal 42($a$). It should be appreciated that a sampling frequency that matches the frequency difference between the centers of the three sub-spectra 18($a$)–18($c$) (FIG. 2) will cause the folding the frequency diverse baseband signal 50($a$) into the baseband I-signal 42($a$). Therefore, wherein the centers of the three sub-spectra 18($a$), 18($b$), and 18($c$) are at 5 MHz, 7 MHz, and 9 MHz respectively, a sampling frequency of 2 MHz will achieve the desired folding.

As such, in the first embodiment wherein the frequency diverse baseband signal 50($a$) is a series of samples clocked at a 28 MHz sampling frequency and the sampling frequency needed for folding the three sub-spectra is a 2 MHz series of values, the decimation filter 52($a$) must operate at a 14:1 decimation factor such that the output is the baseband I-signal 42($a$) represented as a series of samples clocked at 2 MHz.

In operation, decimation filter 52($a$) functions to pass every $14^{th}$ value and ignore the remaining values and as such converts a 28 MHz sample frequency to a 2 MHz sample frequency. It should be appreciated that the output of the decimation filter 52($a$) will have a better signal to noise ratio if the phase of the decimation filter 52($a$) is in phase with the local maxima and minima of the frequency diverse baseband signal 50($a$). Or, stated another way, that the retained values are generally aligned with the peaks and troughs of the frequency diverse baseband signal 50($a$) and the non-peak and non-trough values are the values that are ignored or decimated. It should be appreciated that because the frequency diverse baseband signal 50($a$) is baseband, the period of the frequency diverse baseband signal 50($a$) matches the period of the data symbols communicated thereon.

Figure 4:
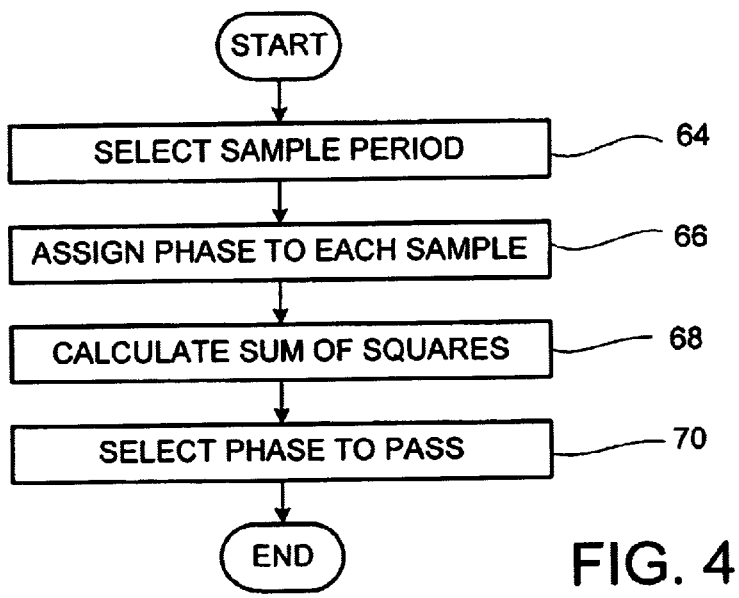
FIG. 4 is a flowchart showing a method of determining the phase of a decimation filter in accordance with one embodiment of this invention.
Figure 5:
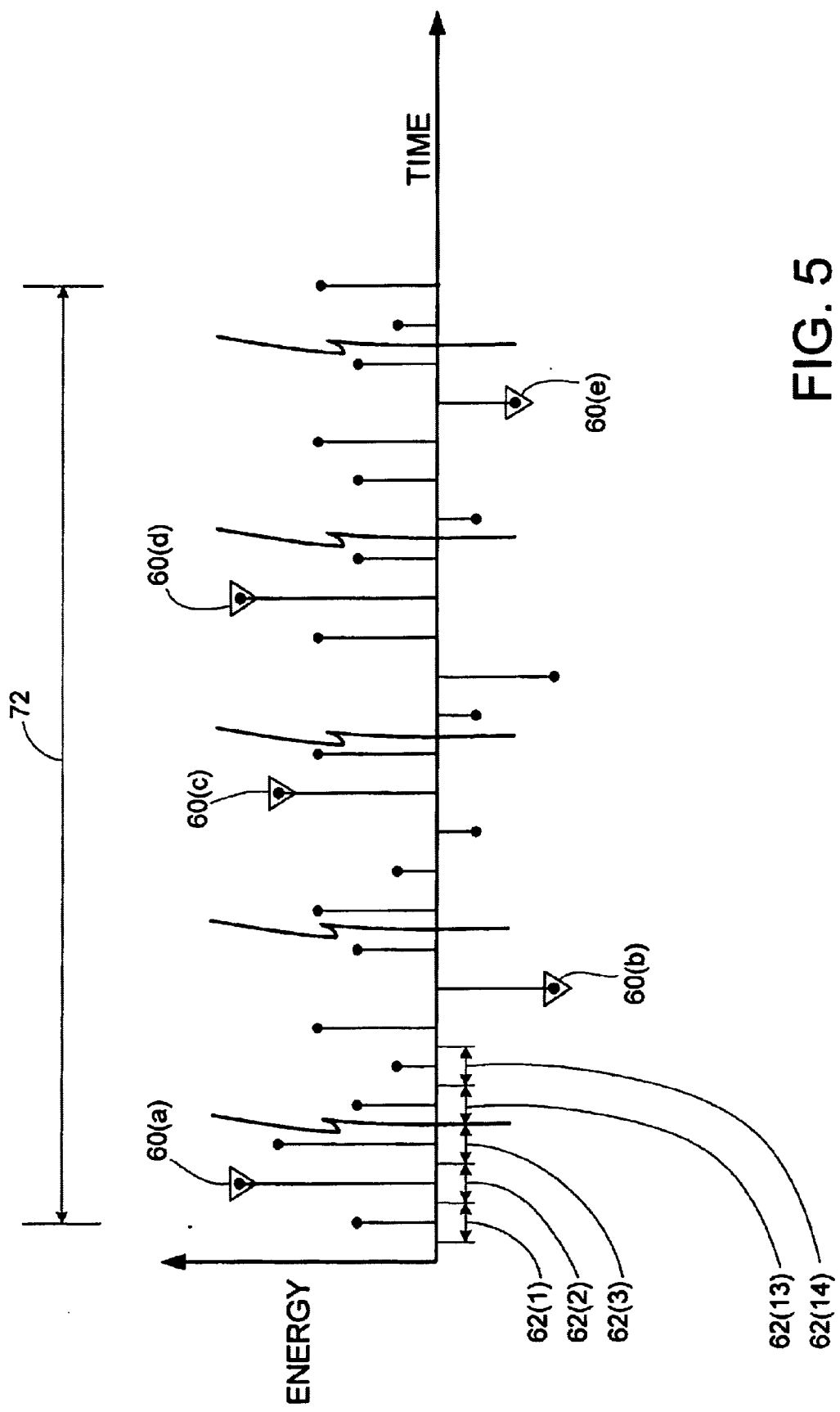
FIG. 5 is a time domain diagram showing a method of determining the phase of a decimation filter in accordance with one embodiment of this invention.

Referring to the flowchart of FIG. 4 and the diagram of FIG. 5, a method for setting the phase of the decimation filter 52($a$) is shown. Samples 60($a$)–60($e$) are in a retained phase group 62(2) while the remaining samples are in the decimated phase groups. The decimation filter has a total quantity of phase groups 62(1)–62(14) that matches the decimation factor (e.g. 14:1) such that samples in the retained phase group (e.g. samples 60($a$)–60($e$) in the phase group 62(2)) may be retained while the samples in the remaining phase groups are decimated.

At step 64, a sample time period 72 is selected. The sample time period 72 is the period in which sample values are analyzed to select the retained phase group. The sample time period preferably comprises a sufficient number of phase periods of the frequency diverse baseband signal 50($a$).

At step 66, each sample is determined to be in one of the phase groups 62(1)–62(14). Next, at step 68, a sum-of-the-squares value is calculated for each phase group 62(1)–62(14). The sum-of-the-squares value or each phase group 62(1)–62(14) is equal to the summation of the square of the value of each sample in the A sample period that is in that particular phase group.

At step 70, the sum-of-the-squares value for each phase group is compared to the other phase groups and the phase group with the highest sum-of-the-squares value is selected as the retained phase group. In the example of FIG. 5, phase group 62(2) has the highest sum of the squares value and is therefore becomes the retained phase group while the remaining phase groups are ignored.

The above described systems and methods effectively recover a baseband I-signal from a frequency diverse QAM carrier signal. Referring again to FIG. 3, the systems and methods for recovery of the baseband Q-signal 42(b) are identical to the above described systems and method for recovery of the baseband I-signal 42(a) except that the digitized carrier signal 38 is mixed down with a digital cosine waveform rather than the digital sine waveform used for recovery of the baseband I-signal 42(a). More specifically, digitized carrier signal 38 is fed to mixer 48(b) which functions identically to mixer 48(a) except that it operates to mix digitized carrier signal 38 with a digitized cosine signal 46(b) to yield frequency diverse baseband signal 50(b). Frequency diverse baseband signal 50(b) is fed to a decimation filter 52(b) which functions identically to the decimation filter 52(a) to fold the sub-spectra of frequency diverse baseband signal 50(b) into baseband Q-signal 42(b).

Figure 6:
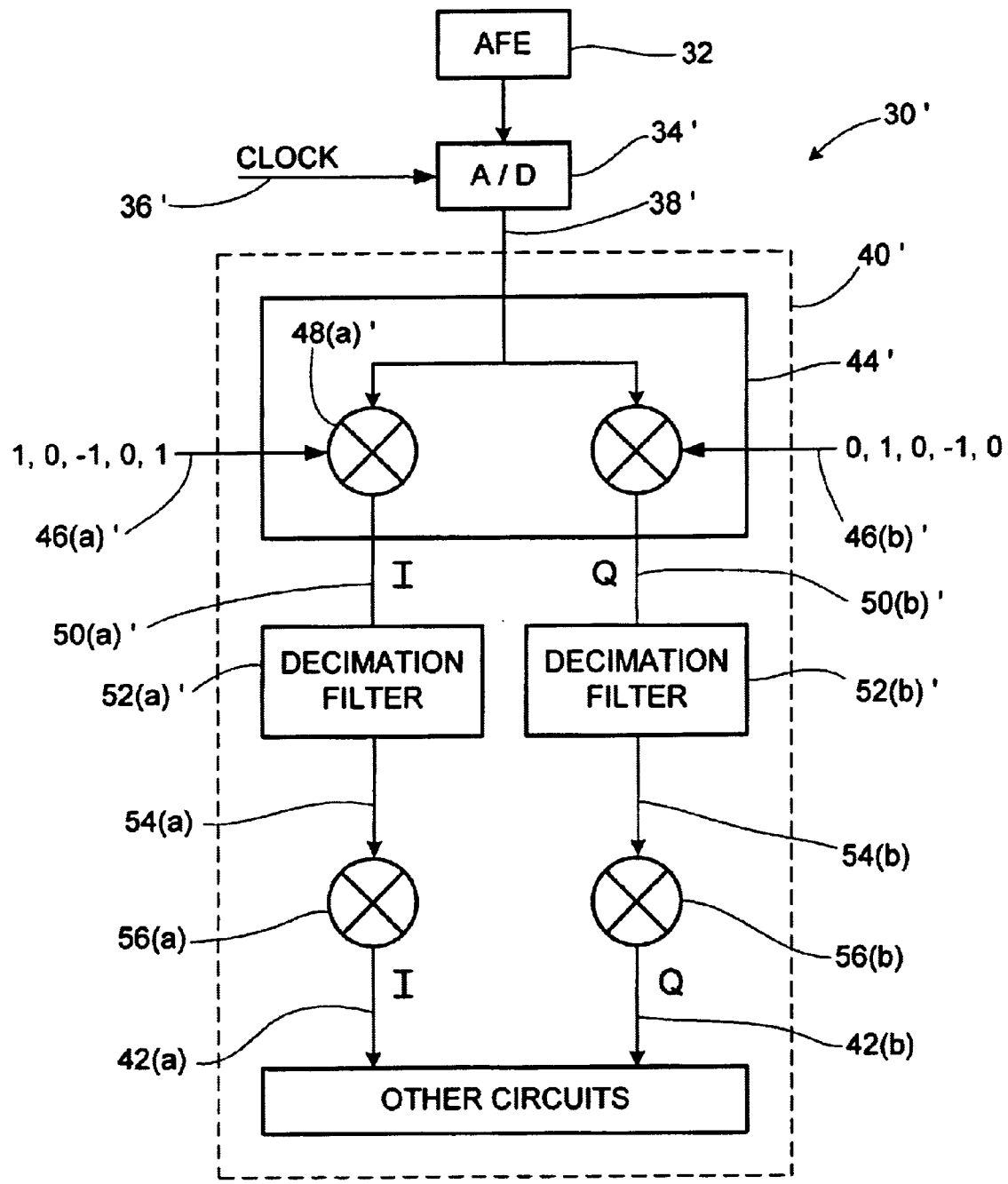
FIG. 6 is a block diagram of a second embodiment of a device for recovery of baseband signals in accordance with the present invention.

In a second embodiment of this invention it is recognized that, because of various design considerations, it is not always preferable to sample the modulated carrier at four-times the carrier frequency. FIG. 6 shows a second embodiment of a device 30' wherein the modulated carrier is sampled by A/D converter 34' at a sampling frequency that is greater than four-times that of the modulated carrier. More specifically, device 30' includes analog front end 32 which, like in the first embodiment, includes known analog circuits tuned to the modulated carrier frequency for receiving a carrier signal from a transmission medium and amplifying such signal as appropriate for sampling by A/D converter 34'. Again, A/D converter 34' is preferably a 10-bit A/D converter and, in this exemplary embodiment wherein the modulated carrier is a 7 MHz signal, the A/D converter is driven by a 32 MHz clock signal 36' such that the output of the A/D converter 34' is a digitized carrier signal 38' comprising a sequence of 10-bit sample values clocked at a sampling frequency of 32 MHz. The digitized carrier signal 38' is then coupled to a demodulator 40' for recovery of the baseband I and Q-signals 42(a) and 42(b) in accordance with this second embodiment of this invention.

The demodulator 40' includes mixer 44' for separating the I and Q-channels from the digitized carrier signal 38'. Mixer 44' includes an I-channel mixer 48(a)' which mixes the digitized carrier signal 38' with a sequence of values representing a digitized sine wave 46(a)'. In this second embodiment, the digitized sine wave 46(a)' has a frequency equal to one-fourth that of the sample frequency such that the digitized sine wave 46(a)' may be represented by a sequence of digital values [1,0,−1,0] clocked at the sample frequency. For example, an 8 MHz sine wave can be represented by the sequence of digital values [1,0,−1,0] clocked at 32 MHz which matches the sample frequency such that mixer 48(a)' is a hardware simple multiplier. It should be appreciated that in this second embodiment, the output of mixer 48(a)' is not the frequency diverse baseband signal because it has been mixed down by 8 MHz as where recovery of baseband requires mixing down by 7 MHz and as such will be called the frequency diverse mixed down signal 50(a)'.

The frequency diverse mixed down signal 50(a)' is input to a decimation filter 52(a)'. Again, the purpose of the decimation filter 52(a)' is to reduce the sample frequency and fold the three mutually exclusive sub-spectrums 18(a)–18(c) (FIG. 2) together. Again, a sampling frequency that matches the frequency difference between the centers of the three sub-spectrums 18(a)–18(c) will result in the folding of the three sub-spectrums in the frequency diverse mixed down signal 50(a)' into an I-channel mixed down signal 54(a). As such, in the preferred embodiment where the centers of the three sub-spectra 18(a), 18(b), and 18(c) are at 5 MHz, 7 MHz, and 9 MHz respectively, a sampling frequency of 2 MHz will achieve the desired folding. To achieve a 2 MHz sampling rate, the decimation filter will operate at a 16:1 decimation factor.

Similar to the first embodiment, it should be appreciated that the output of the decimation filter 52(a)' will be a stronger signal if the decimation is in phase with the local maxima and minima of the frequency diverse mixed down signal 50(a)'. As such, the same method for selecting a decimation phase as previously discussed with respect to FIGS. 4 and 5 will be used to set the phase of decimation filter 52(a)' in this second embodiment. It should be appreciated that because frequency diverse mixed down signal 50(a)' is not baseband, the period of the signal will be other than the period of the data symbols communicated thereon.

The I-channel mixeddown signal 54(a) is fed to a second I-channel mixer 56(a). As previously discussed, in this second embodiment, the I-channel mixeddown signal 54(a) is not a baseband signal because it was mixed down by an 8 MHz digitized sine wave 46(a)' rather than by a 7 MHz sine wave (e.g. matching the carrier frequency) that would have mixed down the digitized carrier signal 38 to baseband. To recover baseband in this second embodiment, the I-channel mixeddown signal 54(a) will need to be mixed up with a 1 MHz digitized sine wave by the second I-channel mixer 56(a).

Because the I-channel mixeddown signal 54(a) has a 2 MHz sampling frequency, the 1 MHz digitized sine wave also must be represent by a 2 MHz sequence of values, which would be a repetitive sequence of [1,−1]. The output of second mixer 56(a) is thus the baseband I-signal 42(a).

Again, the above described systems and methods of this second embodiment effectively recover a baseband I-signal 42(a) from a frequency diverse QAM carrier signal. The systems and methods for recovery of the baseband Q-signal 42(b) are identical to the above described systems and method for recovery of the baseband I-signal 42(a) except that the digitized carrier signal 38' is mixeddown with a one-fourth sampling frequency digitized cosine wave 46(b)' rather than the one-fourth sampling frequency digitized sine wave 46(a)' used to mix down the I-channel. More specifically, digitized carrier signal 38' is fed to mixer 48(b)' which functions identically to mixer 48(a)' except that it operates to mix digitized carrier signal 38' with a digitized cosine signal 46(b)' to yield frequency diverse base mixeddown signal 50(b)'. Frequency diverse mixeddown signal 50(b)' is fed to a decimation filter 52(b)' which functions identically to decimation filter 52(a)' to fold the sub-spectra of frequency diverse mixeddown signal 50(b)' to yield a Q-channel mixeddown signal 54(b). The Q-channel mixeddown signal 54(b) is fed to a second Q-channel mixer 56(b) wherein the Q-channel mixed down signal 54(b) is mixed with a 1 MHz digitized cosine wave, represented by a repetitive sequence [−1,1],clocked at 2 MHz, to yield the baseband Q-signal 42(b)'.

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

What is claimed is:

1. A method of selecting a decimation phase of a decimation filter to filter a sequence of samples, comprising the steps of:

a) determining a plurality of phase groups;

b) assigning each sample to one of the plurality of phase groups;

c) calculating a phase strength value for each phase group; and d) selecting the phase group with the greatest phase strength value as the retained decimation phase.

2. The method of selecting a decimation phase of a decimation filter to filter a sequence of samples of claim 1, wherein a quantity of the plurality of phase groups is equal to a decimation factor of the decimation filter.

3. The method of selecting a decimation phase of a decimation filter to filter a sequence of samples of claim 2, wherein the phase strength value of a phase group represents the sum of the magnitude of the value of each sample in the phase group.

4. The method of selecting a decimation phase of a decimation filter to filter a sequence of samples of claim 3, wherein the phase strength value of a phase group represents the sum of the square of the value of each sample in the phase group.

5. The method of selecting a decimation phase of a decimation filter to filter a sequence of samples of claim 1, wherein the sequence of samples represents a frequency diverse redundant data signal comprising a plurality of adjacent sub spectrums.

6. The method of selecting a decimation phase of a decimation filter to filter a sequence of samples of claim 5, wherein the decimation filter has a decimation factor equal to an input sample frequency divided by a frequency difference between the center of two adjacent sub spectrums.

7. The method of selecting a decimation phase of a decimation filter to filter a sequence of samples of claim 6, wherein the phase strength value of a phase group represents the sum of the magnitude of the value of each sample in the phase group.

8. The method of selecting a decimation phase of a decimation filter to filter a sequence of samples of claim 7, wherein the phase strength value of a phase group represents the sum of the square of the value of each sample in the phase group.

9. The method of selecting a decimation phase of a decimation filter to filter a sequence of samples of claim 8, wherein the data signal is a baseband signal.

10. The method of selecting a decimation phase of a decimation filter to filter a sequence of samples of claim 8, wherein the data signal is other than baseband.

\* \* \* \* \*